(12) United States Patent
Lee et al.

(10) Patent No.: US 7,697,301 B2
(45) Date of Patent: Apr. 13, 2010

(54) PRINTED CIRCUIT BOARD HAVING EMBEDDED ELECTRONIC COMPONENTS AND MANUFACTURING METHOD THEREOF

(75) Inventors: Doo-Hwan Lee, Yongin-si (KR); Byoung-Youl Min, Seongnam-si (KR); Myung-Sam Kang, Daejeon (KR); Moon-Il Kim, Daejeon (KR); Hyung-Tae Kim, Ansan-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 380 days.

(21) Appl. No.: 11/637,664

(22) Filed: Dec. 13, 2006

(65) Prior Publication Data

US 2007/0132536 A1 Jun. 14, 2007

(30) Foreign Application Priority Data

Dec. 13, 2005 (KR) ...................... 10-2005-0122289

(51) Int. Cl.
*H05K 1/18* (2006.01)

(52) U.S. Cl. ...................................... 361/763; 361/760

(58) Field of Classification Search ................. 174/255, 174/258–262; 361/760, 761, 762, 763; 257/678, 257/691, 687, 700, 701, 703, 705
See application file for complete search history.

(56) References Cited

U.S. PATENT DOCUMENTS 6,975,516 B2 * 12/2005 Asahi et al. .................. 361/761
7,379,306 B2 * 5/2008 Sawatari et al. ............. 361/761
7,504,706 B2 * 3/2009 Swaminathan et al. ...... 257/532
2002/0175402 A1 * 11/2002 McCormack et al. ....... 257/700

FOREIGN PATENT DOCUMENTS

| JP | 1-175297 | 7/1989 |
| JP | 2003-31955 | 1/2003 |
| JP | 2005-311249 | 11/2005 |
| WO | 2005/004597 A1 | 1/2005 |

OTHER PUBLICATIONS

Japanese Office Action issued on Feb. 26, 2009 in corresponding Japanese Patent Application 2006-332078.

* cited by examiner

*Primary Examiner*—Jinhee J Lee
*Assistant Examiner*—Yuriy Semenenko

(57) ABSTRACT

A printed circuit board having embedded electronic components and a manufacturing method thereof are disclosed. With the printed circuit board having embedded electronic components, including a core sheet, a first electronic component mounted on one side of the core sheet, a second electronic component mounted on the other side of the core sheet and overlapping the first electronic component, a first insulation layer stacked on one side of the core sheet and covering the first electronic component, a second insulation layer stacked on the other side of the core sheet and covering the second electronic component, and a circuit pattern formed on the surface of the first insulation layer or the second insulation layer, the density of the printed circuit board having embedded components is improved, as a plurality of electronic components are embedded simultaneously, and when a thin CCL substrate or a metal substrate is used as the core, a metal substrate in particular, the heat-releasing property and mechanical strength are improved, including increased bending strength in a thermal-stress environment, as electronic components are mounted on both sides of the core sheet.

8 Claims, 8 Drawing Sheets

FIG. 6
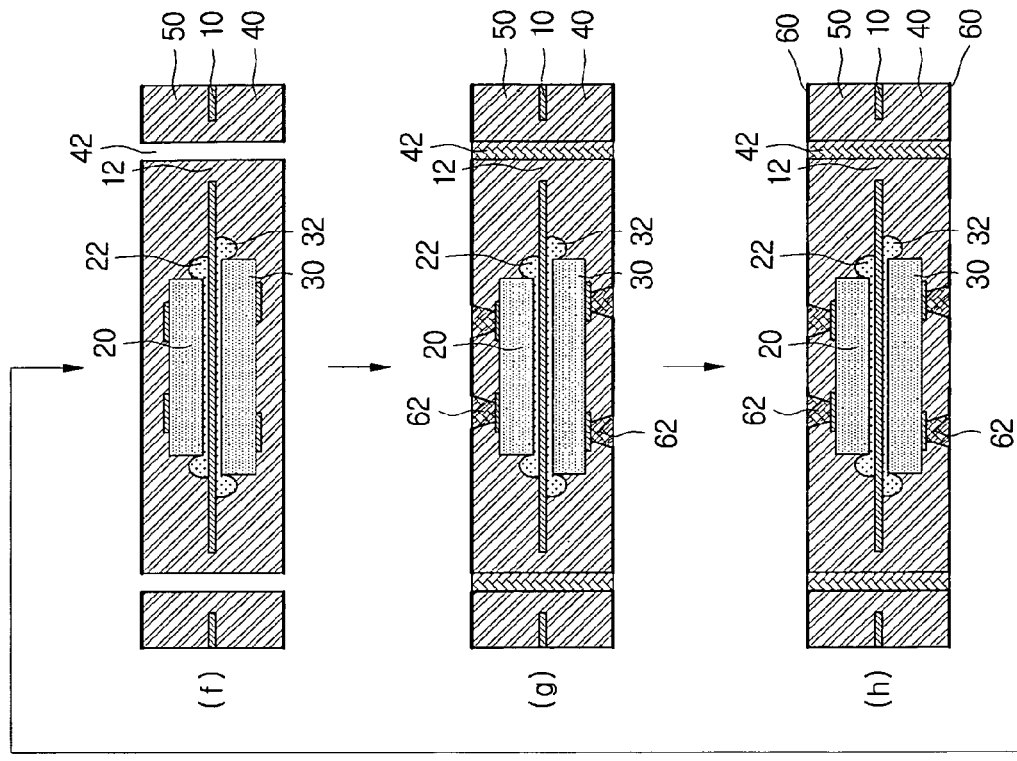
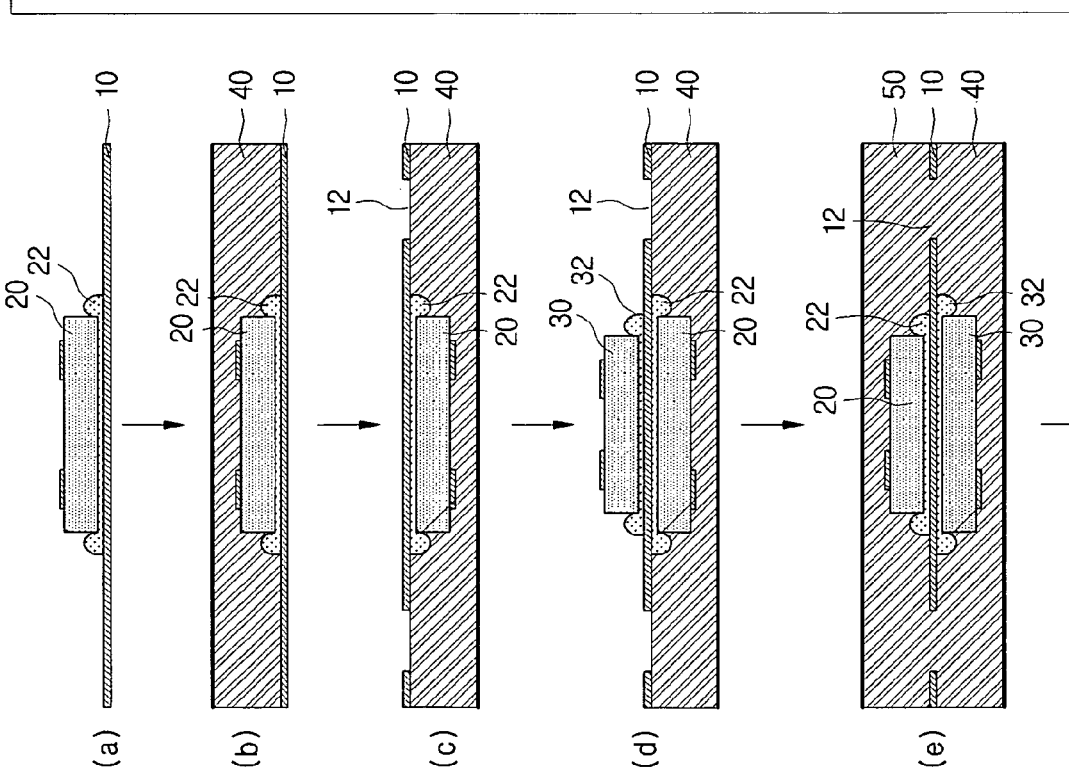

PRINTED CIRCUIT BOARD HAVING EMBEDDED ELECTRONIC COMPONENTS AND MANUFACTURING METHOD THEREOF

CROSS-REFERENCE TO RELATED APPLICATIONS

This application claims the benefit of Korean Patent Application No. 2005-0122289 filed with the Korean Intellectual Property Office on Dec. 13, 2005, the disclosure of which is incorporated herein by reference in its entirety.

BACKGROUND

1. Technical Field

The present invention relates to a printed circuit board, more particularly, to a printed circuit board having embedded electronic components and manufacturing method thereof.

2. Description of the Related Art

As a part of next-generation multi-functional miniature package technology, attention is being focused on the development of a printed circuit board having embedded electronic components. Along with the advantages of multi-functionality and miniaturization, a printed circuit board having embedded electronic components also allows, to a degree, more sophisticated functionalities, as the wiring distance can be minimized in a high-frequency range of 100 MHz or higher, and in some cases, problems in reliability may be resolved for connections between components using wire bonding or solder balls in an FC (flip chip assembly) or a BGA (ball grid array).

However, in a conventional printed circuit board having embedded electronic components, there is a high probability that problems in heat release due to embedding electronic components such as high-density IC's, or problems such as delamination, etc., will affect the yield, and there are difficulties in the overall process that raise the costs of manufacture. Therefore, a technology is required which provides strength for minimizing warpage in thin printed circuit boards, and which provides improvements in heat-releasing property.

Also, the process of embedding electronic components has hitherto involved a structure in which the electronic components are embedded in only one side of the core substrate, or in only one side of the build-up layer, which is inevitably vulnerable to bending in a thermal-stress environment. Thus, there has been a fundamental limit to increasing the number of electronic components embedded.

Examples in related art of the printed circuit board having embedded electronic components include, first, a method of utilizing tape and a molding compound for embedding the electronic components, as shown in FIG. 1. In this invention, liquid epoxy material is utilized in embedding the components after etching an insulation substrate, so as to minimize the thermal and mechanical impact caused by differences in the coefficients of thermal expansion and the coefficients of elasticity between the embedded electronic components, such as IC's, and the substrate. However, it is limited in that the strength and heat-releasing property of the substrate itself are unchanged, and that it involves an asymmetric structure.

A second example includes an invention in which condensers are stacked on both sides of a core substrate for higher-density stacking. However, this considers only the matter of higher-density stacking, and is limited in that it does not consider the heat-releasing property of the substrate, and that it does not complement bending strength by forming a symmetrical structure.

SUMMARY

Aspects of the present invention aim to provide a printed circuit board having embedded components and manufacturing method thereof, which can maintain strength even with a thickness smaller than that of a conventional core substrate, and which can increase the number of embedded electronic components by improving heat release.

One aspect of the present invention provides a printed circuit board having embedded electronic components, including a core sheet, a first electronic component mounted on one side of the core sheet, a second electronic component mounted on the other side of the core sheet and overlapping the first electronic component, a first insulation layer stacked on one side of the core sheet and covering the first electronic component, a second insulation layer stacked on the other side of the core sheet and covering the second electronic component, and a circuit pattern formed on the surface of the first insulation layer or the second insulation layer.

It may be preferable that the core sheet be a metal substrate, which may include aluminum (Al) or copper (Cu) or stainless steel (SS). It may be preferable that the core sheet be a copper clad laminate (CCL).

It may be preferable that the first electronic component and the second electronic component be identical in size and shape. It may also be preferable that the first electronic component and the second electronic component be mounted in symmetry with respect to the core sheet. It may be preferable that the first electronic component or the second electronic component be mounted on the core sheet by way of chip adhesive applied in-between.

The first insulation layer or the second insulation layer may include at least one of prepreg (PPG), rubber coated copper (RCC), and Ajinomoto build-up film (ABF).

In one embodiment, the printed circuit board may further include an IVH (interstitial via hole) that penetrates the first insulation layer, the second insulation layer, and the core sheet, where it may be preferable that a core hole, having a cross section greater than that of the IVH, be formed in the core sheet to allow the IVH to penetrate the core sheet. Preferably, a metal layer may be formed on the inner perimeter of the IVH, and the metal layer may be electrically connected with the circuit pattern.

Another aspect of the present invention provides a method of manufacturing a printed circuit board having embedded electronic components, including (a) mounting a first electronic component on one side of a core sheet, (b) stacking a first insulation layer on one side of the core sheet such that the first insulation layer covers the first electronic component, (c) mounting a second electronic component on the other side of the core sheet such that the second electronic component overlaps the first electronic component, (d) stacking a second insulation layer on the other side of the core sheet such that the second insulation layer covers the second electronic component, and (e) forming a circuit pattern on a surface of the first insulation layer or the second insulation layer.

In one embodiment, the method of manufacturing a printed circuit board having embedded electronic components may further include flipping the core sheet so that the other side of the core sheet is turned to face one side of the core sheet, between the operation (b) of stacking the first insulation layer and the operation (c) of mounting the second electric component.

Also, the method may further include perforating portions of the core sheet to form core holes, before the operation (d) of stacking the second insulation layer, and forming IVH's that penetrate the first insulation layer, the second insulation layer, and the core sheet, after the operation (d) of stacking the second insulation layer.

The method may also further include forming first BVH's (blind via holes) in the first insulation layer in correspondence with the positions of the electrodes of the first electronic component and forming second BVH's in the second insulation layer in correspondence with the positions of the electrodes of the second electronic component, after the operation (d) of stacking the second insulation layer.

Still another aspect of the present invention provides a method of manufacturing a printed circuit board having embedded electronic components, including (a) mounting a first electronic component on one side of a core sheet and mounting a second electric component on the other side of the core sheet such that the second electronic component overlaps the first electronic component, (b) stacking a first insulation layer on one side of the core sheet such that the first insulation layer covers the first electronic component and stacking a second insulation layer on the other side of the core sheet such that the second insulation layer covers the second electronic component, and (c) forming a circuit pattern on a surface of the first-insulation layer or the second insulation layer.

In one embodiment, the method of manufacturing a printed circuit board having embedded electronic components may further include perforating portions of the core sheet to form core holes, before the operation (b) of stacking the first insulation layer and stacking the second insulation layer, and forming IVH's that penetrate the first insulation layer, the second insulation layer, and the core sheet, after the operation (b) of stacking the first insulation layer and stacking the second insulation layer.

The method may further include forming first BVH's (blind via holes) in the first insulation layer in correspondence with the positions of the electrodes of the first electronic component and forming second BVH's in the second insulation layer in correspondence with the positions of the electrodes of the second electronic component, after the operation (b) of stacking the first insulation layer and stacking the second insulation layer.

The core sheet may be a metal substrate, which may include aluminum (Al) or copper (Cu) or stainless steel (SS). It may be preferable that the core sheet be a copper clad laminate (CCL).

It may be preferable that the first electronic component and the second electronic component be identical in size and shape. It may also be preferable that the first electronic component and the second electronic component be mounted in symmetry with respect to the core sheet. It may be preferable that the first electronic component or the second electronic component be mounted on the core sheet by way of chip adhesive applied in-between.

The first insulation layer or the second insulation layer may be prepreg (PPG) or Ajinomoto build-up film (ABF), where the circuit pattern may be formed by stacking a copper foil layer on the surface of the first insulation layer or the second insulation layer. It may be preferable that the first insulation layer and the second insulation layer be RCC.

Preferably, the core holes may have cross sections greater than those of the IVH's to allow the IVH's to penetrate the core sheet. It may be preferable that a metal layer be formed on the inner perimeter of the IVH, and that the metal layer be electrically connected with the circuit pattern.

A plating layer may be formed on the surface of the first BVH's and the second BVH's. The method may further include stacking an insulation layer and a plating layer on the circuit pattern and forming an outer layer circuit on the plating layer.

Additional aspects and advantages of the present invention will be set forth in part in the description which follows, and in part will be obvious from the description, or may be learned by practice of the present invention.

BRIEF DESCRIPTION OF THE DRAWINGS

FIG. 6 is a flow diagram illustrating a process of manufacturing a printed circuit board having embedded electronic components based on the first disclosed embodiment of the present invention.

DETAILED DESCRIPTION

Certain embodiments of the present invention will be described below in more detail with reference to the accompanying drawings. In the description with reference to the accompanying drawings, those components are rendered the same reference number that are the same or are in correspondence regardless of the figure number, and redundant explanations are omitted.

Figure 1:
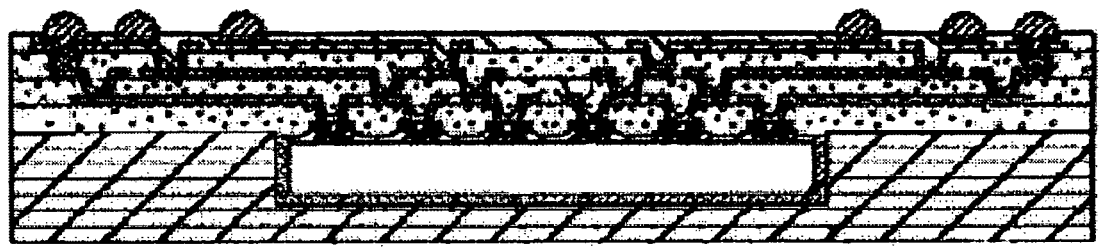
FIG. 1 is a cross-sectional view of a printed circuit board having embedded electronic components according to prior art.
Figure 2:
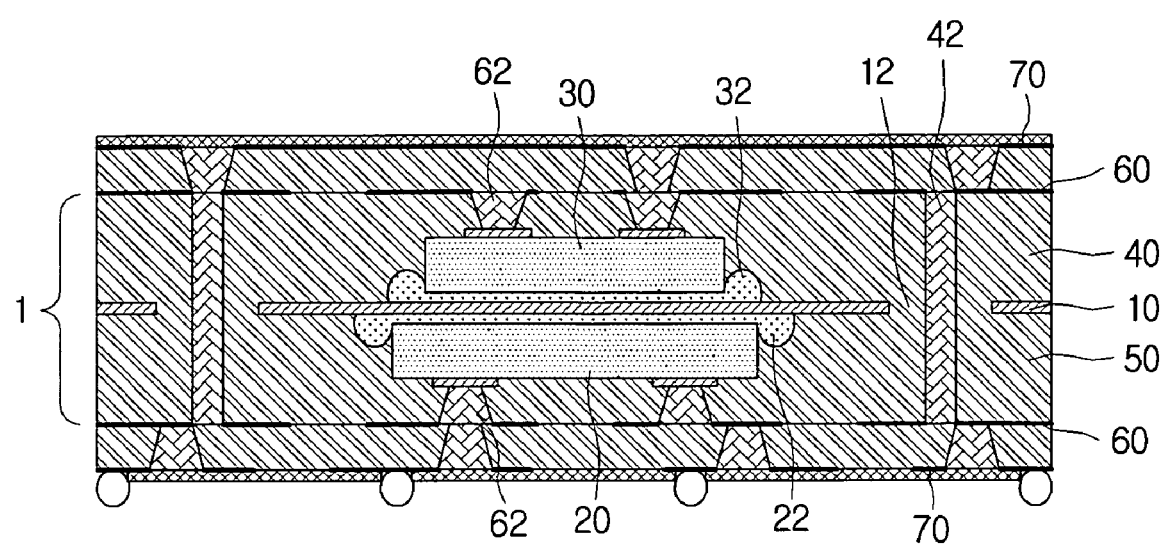
FIG. 2 is a cross-sectional view of a printed circuit board having embedded electronic components based on a first disclosed embodiment of the present invention.

FIG. 2 is a cross-sectional view of a printed circuit board having embedded electronic components based on a first disclosed embodiment of the present invention. In FIG. 2 are illustrated a core substrate 1, a core sheet 10, core holes 12, a first electronic component 20, a second electronic component 30, chip adhesive 22, 32, a first insulation layer 40, IVH's 42, a second insulation layer 50, circuit patterns 60, BVH's 62, and outer layer circuits 70.

A feature of the present invention is the structure of the core substrate 1, in which several electronic components are embedded while maintaining symmetry with respect to the core sheet 10, so as to minimize the complications in introducing materials that have not been used before in the manufacturing process for a printed circuit board having embedded components, maintain mechanical strength even with a thickness equal to or smaller than thicknesses used in prior art, and improve efficiency in heat-releasing.

The core substrate 1 structure based on an embodiment of the present invention has a total of three metal layers formed by: forming holes, which are insulated from the IVH's 42, in the core sheet 10 made of a metal sheet, such as of aluminum (Al), copper (Cu), or stainless steel (SS), etc., or of a thin copper clad laminate (CCL); mounting an electronic component such as an active or passive component in the form of a chip on the core sheet 10, and afterwards stacking a material such as RCC, etc.; and again mounting an electronic component on the opposite side of the core sheet 10 and stacking RCC, etc.

This not only improves the thermal conductivity of the core substrate 1, but also, as the electronic components are mounted in a symmetrical structure with respect to the core sheet 10, allows minimized bending in a thermal-stress environment and improved structural strength of the thin substrate.

However, the description that the electronic components are of a symmetrical structure, in embodiments of the present invention, does not just mean that identical electronic components are mounted in perfect mathematical symmetry, but rather means that there is more symmetry compared to the structure of a conventional core substrate. It is to be appreciated by those skilled in the art that the present invention is not limited to the case where two electronic components mounted on both sides of the core sheet 10 are identical in size, but rather encompasses those cases where the components overlap to demonstrate structural strength.

A printed circuit board based on a first disclosed embodiment of the present invention is composed of a core sheet 10, a first electronic component 20 and a second electronic component 30 mounted on both sides of the core sheet 10, insulation layers stacked to cover the electronic components, and circuit patterns 60 formed on the surfaces of the insulation layers, where the first electronic component 20 and the second electronic component 30 are mounted to be overlapped with each other.

That is, this embodiment has electronic components mounted on both sides of the core sheet 10 such that they overlap each other, to minimize the bending phenomenon of asymmetric structures and to increase structural strength.

In order to thus increase the structural strength of the substrate, it may be desirable to use a metal substrate for the core sheet 10, on both sides of which the electronic components are to be mounted, where a material such as aluminum (Al), copper (Cu), or stainless steel (SS), etc., may be used. Also, a thin copper clad laminate (CCL) may also be used, within a range that ensures structural strength.

However, since the core sheet 10 has functions not only of increasing the structural strength of the substrate but also of effectively releasing heat, it is desirable to select a suitable material in consideration of both strength and thermal conductivity.

Theoretically, it is best if the first electronic component 20 and the second electronic component 30 mounted on both sides of the core sheet 10 are of identical size and shape and are mounted in symmetry with respect to the core sheet 10. However, since an aspect of the present invention is to minimize the bending phenomenon of an asymmetric structure caused by the mounting of electronic components on only one side of the conventional core substrate, the present invention is not limited to symmetrically mounting identical electronic components in a mathematical sense, and it is obvious that those cases of mounting electronic components on both sides of a core sheet 10 in a substantially symmetrical structure to demonstrate strength are also included.

The electronic components may be mounted on the core sheet 10 by way of chip adhesive 22, 32 applied in-between. However, the present invention is not limited to using chip adhesive 22, 32 for mounting the electronic components on the substrate, and other methods may obviously be applied within a range apparent to those skilled in the art.

A typical chip adhesive 22, 32 uses epoxy-based resin. After dispensing the chip adhesive 22, 32 on the core sheet 10 and positioning the electronic components thereon, the chip adhesive 22, 32 is hardened by applying heat, such that the electronic components are mounted on the core sheet 10.

Therefore, the thixotropy of the chip adhesive 22, 32 affects the alignment and position of the electronic components positioned on the chip adhesive 22, 32. In embodiments of the invention, a chip adhesive 22, 32 high in thixotropy is used, so that the thickness of the chip adhesive 22, 32 positioned between the electronic component and the substrate is uniform, and the electronic component is stably aligned in a desired position.

While it may be preferable, when the material of the chip adhesive 22, 32, etc., used for mounting the electronic components is close to a liquid, that a material having thixotropy (high in index value) be utilized, caution is required as the surface energy may apply a mechanical impact on the electronic components during the mounting.

In order to increase the thixotropy, $SiO_2$ may be added as a filler to the conventional epoxy-based resin, but the present invention is not limited to using chip adhesive 22, 32 that includes a $SiO_2$ filler, and it is obvious that any composition may be used, within a scope apparent to those skilled in the art, that provides high thixotropy.

After dispensing the chip adhesive 22, 32 on the core sheet 10 and positioning the electronic components, heat is applied to the chip adhesive 22, 32 for hardening, whereby the electronic components are secured to the core sheet 10. Since, in certain embodiments of the invention, a metal substrate is used as the core sheet 10 which is superior in thermal conductivity, the chip adhesive 22, 32 may be hardened more readily than in prior art, by applying heat to the metal substrate.

That is, the metal substrate based on certain embodiments of the invention may be utilized in positioning the electronic components using the chip adhesive 22, 32. Specifically, since heat may readily be transferred through the metal substrate not only after positioning the electronic components on the chip adhesive 22, 32, but also, if necessary, before dispensing the chip adhesive 22, 32 and positioning the electronic components, the extent to which the chip adhesive 22, 32 is hardened can readily be adjusted, for an effect of improving the positioning of the electronic components.

Meanwhile, when using a chip adhesive 22, 32 having superior thixotropy as described above, a hardening agent may be used, within a scope apparent to those skilled in the art, to facilitate the hardening by heating.

By thus heating the metal substrate to harden the chip bond adhesive after positioning the electronic components using a highly thixotropic chip adhesive 22, 32, the positioning process is improved for the electronic components mounted in the printed circuit board.

After mounting the electronic components, insulation layers such as of prepreg (PPG), rubber coated copper (RCC), or Ajinomoto build-up film (ABF), etc., are stacked. After stacking the insulation layers, an additive or subtractive method may be applied to form circuit patterns 60. The above procedures may be repeated to form a multilayer printed circuit board.

As described above, circuit patterns 60 are formed on the surfaces of the insulation layers, and for electrical interconnection between circuit patterns 60 formed on both sides of the core substrate 1, IVH's 42 are formed which penetrate the first insulation layer 40, second insulation layer 50, and core sheet 10.

Since an electrically conductive member, such as a metal substrate or CCL, etc., is used for the core sheet 10 based on an embodiment of the present invention, forming IVH's 42 that penetrate the core sheet 10 by means of drilling, etc., and forming metal layers such as plating, etc., on the inner perimeters of the IVH's 42 create a risk of short-circuiting between the IVH'S 42 and the core sheet 10. To prevent this, it may be desirable to form core holes 12 beforehand, which have cross sections greater than those of the IVH's 42, such that allow the IVH's 42 to penetrate the core sheet 10.

The core holes 12 may be formed in the core sheet 10 before mounting the electronic components, or may be formed after mounting the electronic components and before stacking the insulation layers.

As such, in the first disclosed embodiment, a multilayer BGA (ball grid array) board is formed by mounting the electronic components on both sides of the core sheet 10 and stacking the insulation layers to form the core substrate 1, forming additional outer layer circuits 70 thereon, and afterwards performing the processes of solder resist (SR) coating, surface treatment, and solder ball attaching, etc.

Generally, for a printed circuit board having embedded electronic components, the cost of the embedded electronic components is much higher than the cost of the substrate, while an error in an embedded component renders the entire board unusable. Thus, it may be more efficient, in terms of economy, to apply embodiments of the present invention to BGA boards, of which the focus is on high density, than to regular multilayer printed circuit boards.

Figure 3:
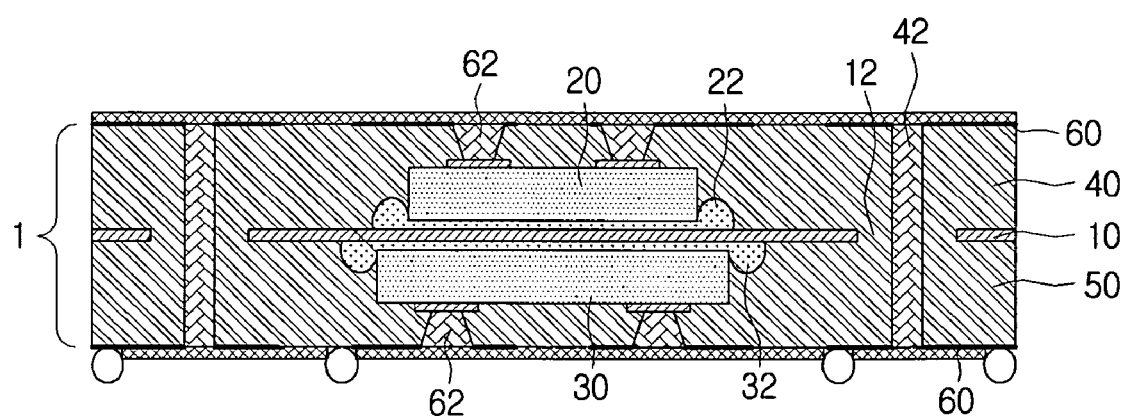
FIG. 3 is a cross-sectional view of a printed circuit board having embedded electronic components based on a second disclosed embodiment of the present invention.

FIG. 3 is a cross-sectional view of a printed circuit board having embedded electronic components based on a second disclosed embodiment of the present invention. In FIG. 3 are illustrated a core substrate 1, a core sheet 10, core holes 12, a first electronic component 20, a second electronic component 30, chip adhesive 22, 32, a first insulation layer 40, IVH's 42, a second insulation layer 50, circuit patterns 60, and BVH's 62.

Unlike the first disclosed embodiment, the processes of solder resist (SR) coating, surface treatment, and solder ball attaching, etc., are performed immediately after forming the core substrate 1, in the second disclosed embodiment, to form a BGA (ball grid array) board having a total of two circuit patterns 60.

Such a case of performing surface treatment directly on the core substrate 1, without forming multilayer circuits, may be applied to the latest field of PoP (Package-on-Package) memory, in which high density and reduction in thickness are required. With conventional PoP memory, there was a problem of increased thickness due to stacking, and with thickness reduction becoming an important issue in the slim-type cell phone, etc., which is one of the application fields of PoP, embodiments of the present invention may provide a solution of reducing thickness while embedding electronic components in the substrate.

Figure 4:
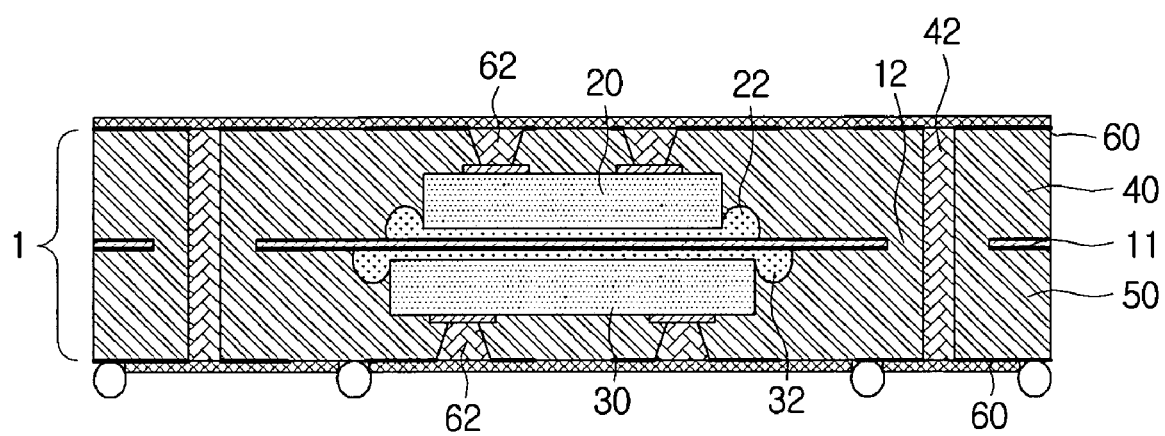
FIG. 4 is a cross-sectional view of a printed circuit board having embedded electronic components based on a third disclosed embodiment of the present invention.

FIG. 4 is a cross-sectional view of a printed circuit board having embedded electronic components based on a third disclosed embodiment of the present invention. In FIG. 4 are illustrated a core substrate 1, a core sheet 11, core holes 12, a first electronic component 20, a second electronic component 30, chip adhesive 22, 32, a first insulation layer 40, IVH's 42, a second insulation layer 50, circuit patterns 60, and BVH's 62.

Unlike the first and second disclosed embodiments, a thin layer of copper clad laminate (CCL) is used for the core sheet 11 in the third disclosed embodiment. As illustrated in FIG. 4, the present invention is not limited to using a metal substrate for the core sheet 11, and other substrates, such as a copper clad laminate, etc., may obviously be used which maintains bending strength in a heat-releasing and thermal-stress environment, within a scope apparent to those skilled in the art.

Figure 5:
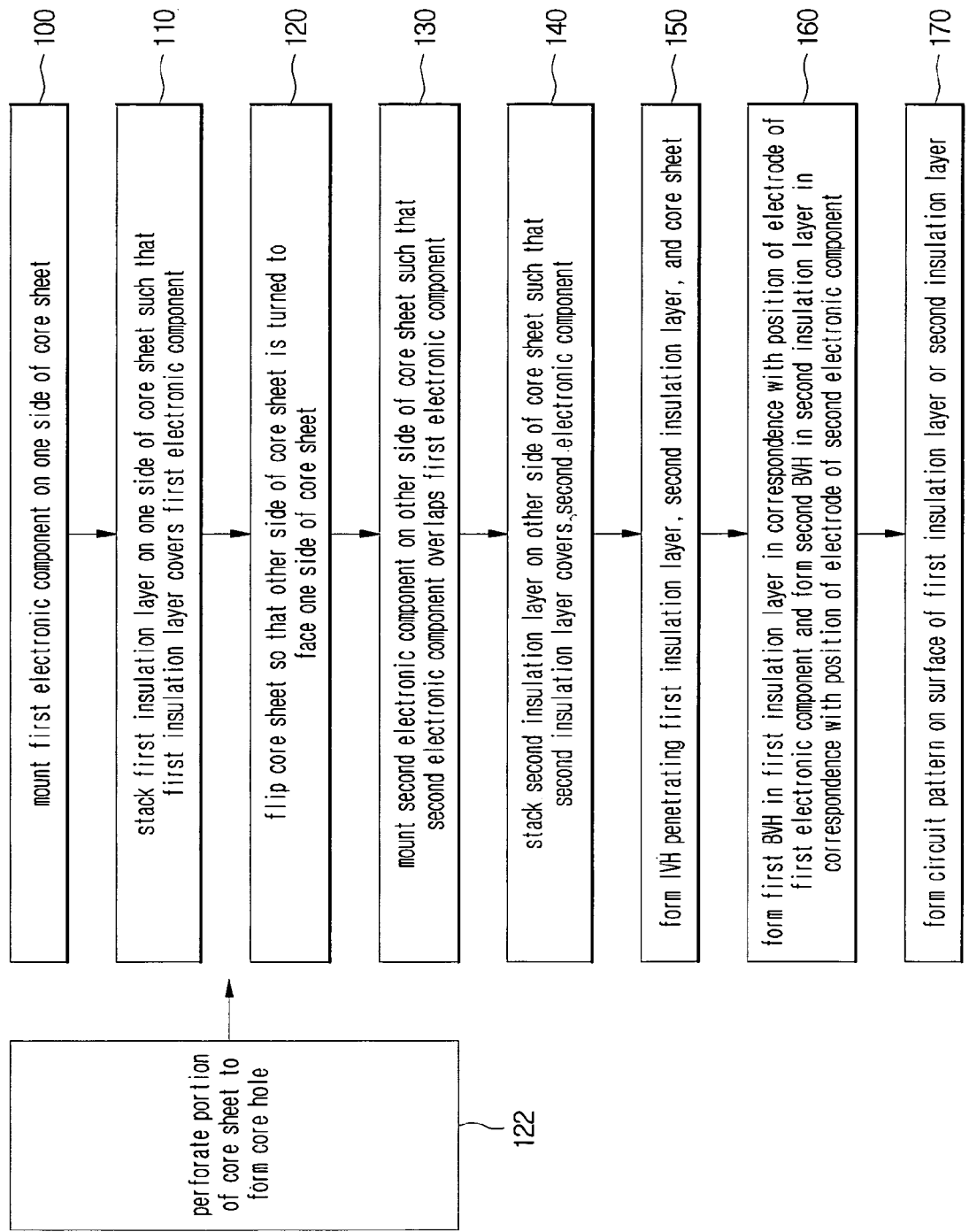
FIG. 5 is a flowchart illustrating a method of manufacturing a printed circuit board having embedded electronic components based on the first disclosed embodiment of the present invention.

FIG. 5 is a flowchart illustrating a method of manufacturing a printed circuit board having embedded electronic components based on the first disclosed embodiment of the present invention, and FIG. 6 is a flow diagram illustrating a process of manufacturing a printed circuit board having embedded electronic components based on the first disclosed embodiment of the present invention. In FIG. 6 are illustrated a core sheet 10, core holes 12, a first electronic component 20, second electronic component 30, chip adhesive 22, 32, a first insulation layer 40, IVH's 42, a second insulation layer 50, circuit patterns 60, BVH's 62, and outer layer circuits 70.

In order to manufacture a printed circuit board which has improved strength against bending and which allows higher-density stacking, by embedding electronic components on both sides of a core sheet 10 symmetrically as described above, first, the first electronic component 20 is mounted on one side of the core sheet 10 (100), as in (a) of FIG. 6, and a first insulation layer 40 is stacked (110) to cover the first electronic component 20, as in (b) of FIG. 6.

An aspect of the present invention is to enhance the bending strength and the heat-releasing property of a printed circuit board having embedded components, and as described above, a metal substrate of aluminum (Al), copper (Cu), or stainless steel (SS), etc., or a thin copper clad laminate (CCL) may be used for the core sheet 10, within a range that ensures structural strength.

As an electronic component is mounted and an insulation layer is stacked typically with the core sheet 10 placed on a stiffener, the stacking of the first insulation layer 40 is followed by a process of flipping the core sheet 10 (120), as in (c) of FIG. 6, so as to mount the second electronic component 30 on the other side of the core sheet 10.

Of course, when the electronic component can be mounted on the other side of the core sheet 10 without turning the core sheet 10, such as by using a jig, etc., specially designed for this purpose, the process of flipping the core sheet 10 may be omitted. In this case, the mounting of the electronic components and the stacking of the insulation layers may be performed on both sides of the core sheet 10 simultaneously, as will be discussed below.

After turning the core sheet 10, the second electronic component 30 is mounted (130) on the other side of the core sheet 10, as in (d) of FIG. 6, and the second insulation layer 50 is stacked (140) to cover the second electronic component 30, as in (e) of FIG. 6. The second electronic component 30 is mounted to overlap the first electronic component 20 and thus form a structure in which the electronic components are arranged symmetrically, whereby the strength against bending stresses is improved, as described above.

While it may be most preferable, for embedding the electronic components symmetrically with respect to the core sheet 10, that the first electronic component 20 and second electronic component 30 be identical in size and shape, the present invention is not limited to symmetry of a mathematical sense, as has been discussed above.

The electronic components are mounted on the core sheet 10 by way of chip adhesive 22, 32 applied in-between, where using a product high in thixotropy may align the electronic components stably in the desired positions for improved positioning.

Thus embedding the electronic components by mounting the electronic components on the core sheet 10 and covering with insulation layers allows a reduced process, compared to the conventional process of perforating portions of a core substrate to form cavities and afterwards embedding the electronic components in the cavities. Also, circuit patterns 60 can be designed on portions where circuit patterns 60 could not have been designed because of the cavities in prior art, so that the wiring density is increased.

Materials such as prepreg (PPG), ABF, etc., may be used for the insulation layers, and copper foil layers are stacked on the insulation layers by plating, etc., so that the subsequent process of forming the circuit patterns 60 can be applied. Meanwhile, the circuit patterns 60 may be formed with more efficiency when using RCC for the insulation layers, as the process of stacking the copper foil layers may be omitted.

To electrically interconnect the circuit patterns 60 formed on the surfaces of the insulation layers, IVH's 42 are formed (150) that penetrate the first insulation layer 40, second insulation layer 50, and core sheet 10, as in (f) of FIG. 6. As metal layers are formed on the inner perimeters of the IVH's 42, there may be a risk of electrical short-circuiting between the core sheet 10, which uses a conductive member such as a metal substrate, etc., and the IVH's 42.

Thus, portions of the core sheet 10 are perforated as in (c) of FIG. 6, and core holes 12 are formed (122) beforehand, which have greater cross sections than do the IVH's 42, to allow the IVH's 42 to penetrate the core sheet 10.

The core holes 12 are formed in correspondence with the positions where the IVH's 42 are to be formed, and are formed with cross sections greater than those of the IVH's 42, so that the IVH's 42 may pass without contact, whereby the IVH's 42 and the core sheet 10 are electrically insulated.

Lastly, as in (h) of FIG. 6, circuit patterns 60 are formed (170) on the surfaces of the first insulation layer 40 and/or the second insulation layer 50 to complete the core substrate 1. A conventional additive process or subtractive process may be applied to the method of forming a circuit pattern 60 on the surface of an insulation layer.

To electrically connect the circuit patterns 60 and the electronic components, BVH's (blind via holes) 62 are formed in the insulation layers in correspondence with the positions of the electrodes of the electronic components, as in (g) of FIG. 6, before forming the circuit patterns 60. Electrical interconnection between the electrodes of the electronic components and the circuit patterns 60 is implemented by performing plating, etc., on the surfaces of the BVH's 62, during the process of forming the circuit patterns 60. That is, first BVH's 62 are formed in the first insulation layer 40 in correspondence with the position of the first electronic component 20, and second BVH's 62 are formed in the second insulation layer 50 in correspondence with the position of the second electronic component 30 (160).

The core substrate 1 of certain embodiments of the present invention is completed by mounting electronic components on both sides of a core sheet 10, stacking insulation layers thereon, and then forming circuit patterns 60 on the surfaces of the insulation layers, while subsequent processes may be performed, of further stacking insulation layers and copper foil layers on the circuit patterns 60 and forming outer layer circuits 70 on the copper foil layers, to manufacture a multi-layer printed circuit board.

Figure 7:
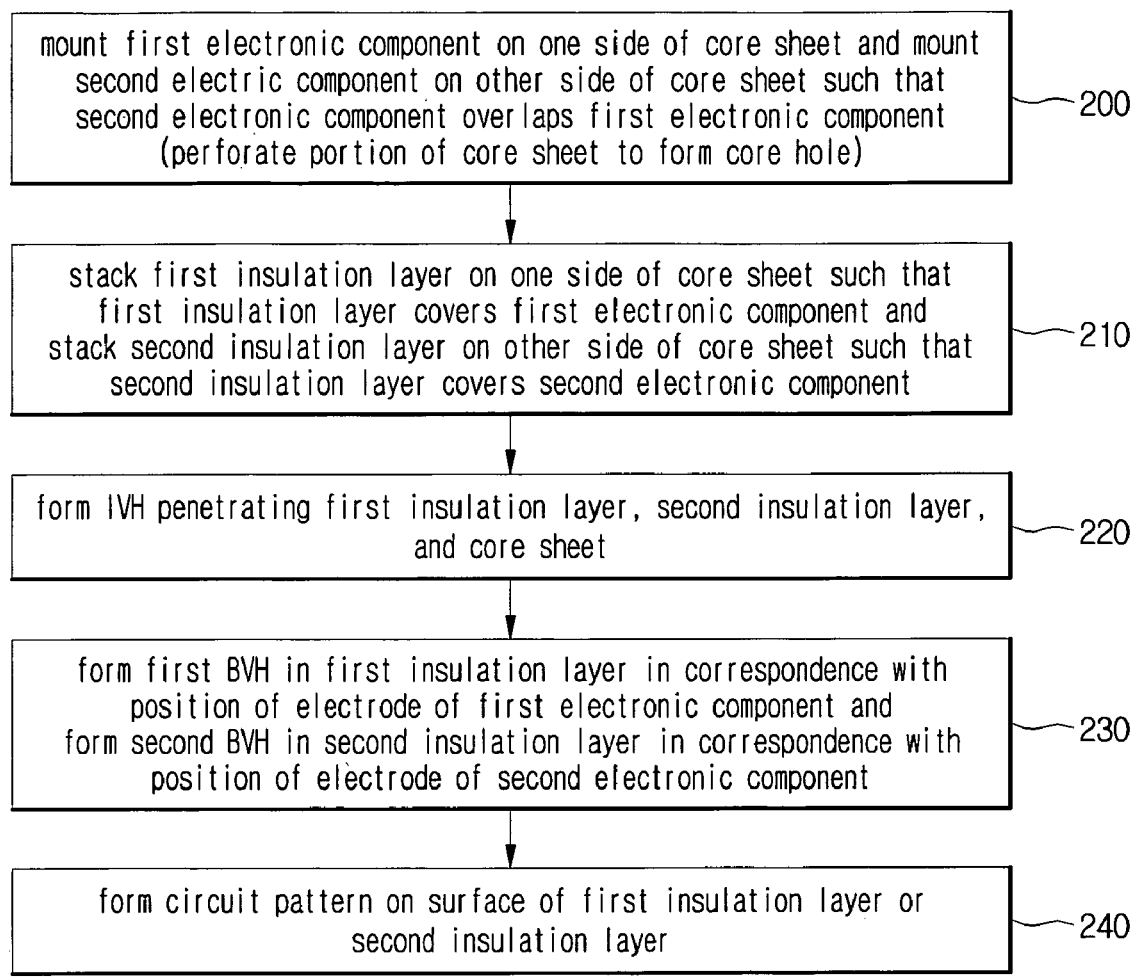
FIG. 7 is a flowchart illustrating a method of manufacturing a printed circuit board having embedded electronic components based on the second disclosed embodiment of the present invention.
Figure 8:
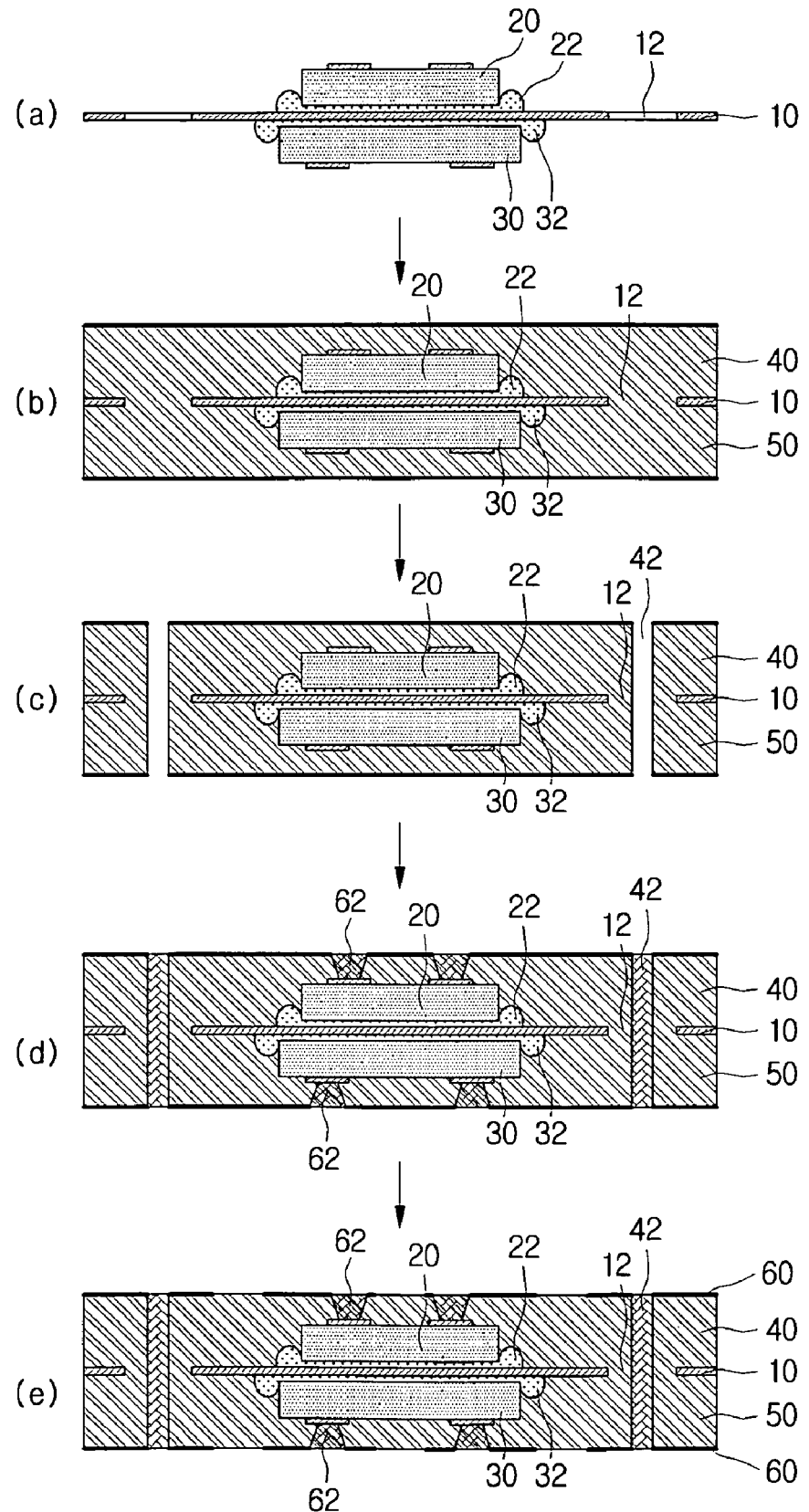
FIG. 8 is a flow diagram illustrating a process of manufacturing a printed circuit board having embedded electronic components based on the second disclosed embodiment of the present invention.

FIG. 7 is a flowchart illustrating a method of manufacturing a printed circuit board having embedded electronic components based on the second disclosed embodiment of the present invention, and FIG. 8 is a flow diagram illustrating a process of manufacturing a printed circuit board having embedded electronic components based on the second disclosed embodiment of the present invention. In FIG. 8 are illustrated a core sheet 10, core holes 12, a first electronic component 20, a second electronic component 30, chip adhesive 22, 32, a first insulation layer 40, IVH's 42, a second insulation layer 50, circuit patterns 60, and BVH's 62.

Unlike the first disclosed embodiment, a feature of the second disclosed embodiment is that the electronic components are mount on both sides of the core sheet 10 simultaneously. With respect to the core sheet 10, one side corresponds to a top side, and the other side corresponds to a bottom side, so that a method is required of mounting electronic components on the bottom side without turning the core sheet 10, within a scope apparent to those skilled in the art, such as of using a jig specially designed for this purpose.

To manufacture a printed circuit board based on the second disclosed embodiment, first, the first electronic component 20 is mounted on one side of the core sheet 10, and the second electronic component 30 is mounted on the other side of the core sheet 10 to overlap the first electronic component 20 (200), as in (a) of FIG. 8.

To raise the structural strength and heat-releasing property of the printed circuit board, a metal substrate, such as of aluminum (Al), copper (Cu), or stainless steel (SS), etc., or a thin copper clad laminate (CCL) is used for the core sheet 10.

In order to minimize the bending phenomenon in the thermal-stress environment created during the manufacturing process of a printed circuit board, it may be desirable for the first electronic component 20 and second electronic component 30 to be of identical size and shape and mounted symmetrically with respect to the core sheet 10. However, it is apparent to those skilled in the art that the sizes, shapes, and mounting positions of the electronic components may vary, within a range of a substantially symmetrical structure that ensures structural strength.

The electronic components are mounted on the core sheet 10 by way of chip adhesive 22, 32 applied in-between, where a chip adhesive 22, 32 high in thixotropy may be desirable for improving the positioning of the electronic components mounted.

As described above, to implement electrical connection between the IVH's 42 and the core sheet 10, portions of the core sheet 10 are perforated in positions where the IVH's 42 are to be formed, to create core holes 12 having cross sections greater than those of the IVH's 42. Next, as in (b) of FIG. 8, the first insulation layer 40 is stacked on one side of the core sheet 10 to cover the first electronic component 20, and the second insulation layer 50 is stacked on the other side of the core sheet 10 to cover the second electronic component 30 (210).

Materials such as prepreg (PPG), ABF, etc., may be used for the insulation layers, and copper foil layers are formed on the insulation layers by plating, etc., to allow the forming of the circuit patterns 60. Meanwhile, the circuit patterns 60 may be formed with more efficiency when using RCC for the insulation layers, as the process of stacking the copper foil layers may be omitted.

Next, as in (c) of FIG. 8, IVH's 42 are formed that penetrate the first insulation layer 40, second insulation layer 50, and core sheet 10, and metal layers are formed on the inner perimeters of the IVH's 42 by plating, etc., for electrical interconnection between circuit patterns 60 (220).

Before forming the circuit patterns 60 on the surfaces of the insulation layers, first BVH's (blind via holes) 62 are formed in the first insulation layer 40 in correspondence with the positions of the electrodes of the first electronic component 20, and second BVH's 62 are formed in the second insulation layer 50 in correspondence with the positions of the electrodes of the second electronic component 30 (230), as in (d) of FIG. 8, to implement electrical connection between the circuit patterns 60 and the embedded electrical components. Metal layers are formed by plating on the surfaces of the BVH's 62, to electrically connect the electronic components and the circuit patterns 60.

Lastly, as in (e) of FIG. 8, the circuit patterns 60 are formed on the surfaces of the insulation layers to complete the core substrate 1 (240). As described above, to manufacture a multilayer printed circuit board, additional insulation layers and copper foil layers may be stacked on the circuit patterns 60, with outer layer circuits 70 formed on the copper foil layers.

According to certain aspects of the invention as set forth above, the density of the printed circuit board having embedded components is improved, as a plurality of electronic components are embedded simultaneously, and the heat-releasing property and mechanical strength are improved, including increased bending strength in a thermal-stress environment, as electronic components are mounted on both sides of a core sheet which is a metal substrate.

Also, as the process of forming cavities is omitted in the process of embedding the electronic components, the process is reduced, and circuit patterns may be designed in portions where there were cavities in prior art, to improve wire density.

Further, the respective BVH process and process such as plating for the two electronic components mounted on both sides of the core sheet can be performed by integrated processes, to improve process efficiency and reduce costs.

While the present invention has been described with reference to particular embodiments, it is to be appreciated that various changes and modifications may be made by those skilled in the art without departing from the spirit and scope of the present invention, as defined by the appended claims and their equivalents.

What is claimed is:

1. A printed circuit board having embedded electronic components, the printed circuit board comprising:
   a metal sheet;
   a first electronic component mounted on one side of the metal sheet;
   a second electronic component mounted on the other side of the metal sheet and overlapping the first electronic component;
   a first insulation layer stacked on one side of the metal sheet and covering the first electronic component;
   a second insulation layer stacked on the other side of the metal sheet and covering the second electronic component; and
   a circuit pattern formed on a surface of the first insulation layer or the second insulation layer.

2. The printed circuit board of claim 1, wherein the metal sheet includes aluminum (Al) or copper (Cu) or stainless steel (SS).

3. The printed circuit board of claim 1, wherein the first electronic component and the second electronic component are identical in size and shape.

4. The printed circuit board of claim 1, wherein the first electronic component and the second electronic component are mounted in symmetry with respect to the metal sheet.

5. The printed circuit board of claim 1, wherein the first electronic component or the second electronic component are mounted on the metal sheet by way of a chip adhesive applied in-between.

6. The printed circuit board of claim 1, wherein the first insulation layer or the second insulation layer includes at least one of prepreg (PPG), rubber coated copper (RCC), and Ajinomoto build-up film (ABF).

7. The printed circuit board of claim 1, further comprising an interstitial via hole (IVH) penetrating the first insulation layer, the second insulation layer, and the metal sheet, wherein a core hole, having a cross section greater than that of the IVH, is formed in the metal sheet to allow the IVH to penetrate the metal sheet.

8. The printed circuit board of claim 7, wherein a metal layer is formed on an inner perimeter of the IVH, and the metal layer is electrically connected with the circuit pattern.

* * * * *